United States Patent
Chen et al.

(10) Patent No.: US 11,764,736 B2
(45) Date of Patent: Sep. 19, 2023

(54) BIAS COMPENSATION CIRCUIT OF AMPLIFIER

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 37 days.

(21) Appl. No.: 17/392,205

(22) Filed: Aug. 2, 2021

(65) Prior Publication Data
US 2022/0350359 A1    Nov. 3, 2022

(30) Foreign Application Priority Data
Apr. 28, 2021    (TW) ................... 110115323

(51) Int. Cl.
*H03G 3/30*    (2006.01)
*H03F 1/30*    (2006.01)
(Continued)

(52) U.S. Cl.
CPC ............. *H03F 1/30* (2013.01); *H03F 1/0261* (2013.01); *H03F 3/04* (2013.01); *H03G 3/10* (2013.01); *H03G 3/30* (2013.01)

(58) Field of Classification Search
CPC ........ H03F 1/30; H03F 1/302; H03F 2200/18; H03F 1/301; H03F 3/04; H03F 1/0261; H03G 3/3042; H03G 3/3047
(Continued)

(56) References Cited

U.S. PATENT DOCUMENTS

| 6,617,928 B2 * | 9/2003 | Finlay ................. H03F 1/302 330/296 |
| 6,771,128 B1 * | 8/2004 | Yamashita ............ H03G 7/06 330/285 |

(Continued)

FOREIGN PATENT DOCUMENTS

| CN | 203457108 U | 2/2014 |
| GB | 2 209 254 A | 5/1989 |

OTHER PUBLICATIONS

European partial search report dated Jun. 23, 2022 for the EP application No. 21218244.8, filing date Dec. 30, 2021, pp. 1-14, Jun. 23, 2022.

(Continued)

*Primary Examiner* — Khanh V Nguyen
(74) *Attorney, Agent, or Firm* — Winston Hsu

(57) ABSTRACT

The present invention discloses a bias compensation circuit. The bias compensation circuit includes a detecting circuit, including a diode-connected transistor circuit, with a first end for receiving a first current, and a second end coupled to a first reference voltage end; and a first diode circuit, with a first end for receiving a second current, and a second end coupled to the first reference voltage end; wherein the detecting circuit provides a first voltage level according to the diode-connected transistor circuit, and provides a second voltage level according to the first diode circuit; a voltage-current converting circuit, coupled to the detecting circuit, for generating a first reference current according to the first voltage level and the second voltage level; and a bias circuit, coupled to the voltage-current converting circuit, for receiving the first reference current, to provide a bias voltage level according to the first reference current.

19 Claims, 8 Drawing Sheets

(51) Int. Cl.
*H03G 3/10* (2006.01)
*H03F 1/02* (2006.01)
*H03F 3/04* (2006.01)

(58) Field of Classification Search
USPC .................................................. 330/285, 296
See application file for complete search history.

(56) References Cited

U.S. PATENT DOCUMENTS

| | | | | |
|---|---|---|---|---|
| 6,809,593 | B1* | 10/2004 | Newman | H03F 3/211 330/296 |
| 7,049,892 | B2* | 5/2006 | Matsunaga | H03G 1/0017 330/285 |
| 7,279,978 | B2* | 10/2007 | Scuderi | H03G 1/0017 330/296 |
| 7,629,851 | B2* | 12/2009 | Tsurumaki | H03F 1/301 330/285 |
| 7,692,490 | B2* | 4/2010 | Cho | H03F 1/0266 330/296 |
| 8,098,102 | B2* | 1/2012 | Hase | H03F 3/68 330/285 |
| 2004/0090267 | A1 | 5/2004 | Nagamori | |
| 2004/0130374 | A1 | 7/2004 | Barry | |
| 2005/0083129 | A1 | 4/2005 | Tsurumaki | |
| 2006/0152287 | A1 | 7/2006 | Greene | |
| 2007/0222520 | A1 | 9/2007 | Inamori | |
| 2014/0300419 | A1 | 10/2014 | Kawai | |
| 2017/0126183 | A1 | 5/2017 | Honda | |
| 2019/0020317 | A1 | 1/2019 | Chen | |
| 2019/0158041 | A1 | 5/2019 | Hur | |
| 2019/0190457 | A1 | 6/2019 | Satou | |
| 2019/0372527 | A1 | 12/2019 | Tanoi | |
| 2020/0099339 | A1 | 3/2020 | Chen | |
| 2020/0336116 | A1 | 10/2020 | Choi | |
| 2020/0341501 | A1 | 10/2020 | Chien | |
| 2020/0382082 | A1 | 12/2020 | Honda | |

OTHER PUBLICATIONS

European search report dated Oct. 4, 2022 for the EP application No. 21218244.8, filing date Dec. 30, 2021, p. 1-15, Oct. 4, 2022.

* cited by examiner

US 11,764,736 B2

BIAS COMPENSATION CIRCUIT OF AMPLIFIER

TECHNICAL FIELD

The present invention relates to a circuit, and more particularly, to a bias compensation circuit for an amplifier.

BACKGROUND

In the prior art, the power amplifier has been widely implemented in various circuits to improve signal quality of the circuits. In this situation, a bias compensation circuit can be used to improve performance of the power amplifier. However, due to different process corners of the bias compensation circuit, there is an offset current passing through the power amplifier, which makes the performance of the power amplifier different (i.e., unstable). In addition, a different input power of the power amplifier introduces a different temperature of the power amplifier, which also affects the current passing through the power amplifier. Thus, how to compensate the effect of the above factors on the current to maintain the stability of the current passing through the power amplifier is a problem to be solved.

SUMMARY

It is therefore an objective of the present invention to provide a bias compensation circuit to solve the problems above.

The present invention discloses a bias compensation circuit. The bias compensation circuit includes a detecting circuit, including a diode-connected transistor circuit, with a first end for receiving a first current, and a second end coupled to a first reference voltage end; and a first diode circuit, with a first end for receiving a second current, and a second end coupled to the first reference voltage end; wherein the detecting circuit provides a first voltage level according to the diode-connected transistor circuit, and provides a second voltage level according to the first diode circuit; a voltage-current converting circuit, coupled to the detecting circuit, for generating a first reference current according to the first voltage level and the second voltage level; and a bias circuit, coupled to the voltage-current converting circuit, for receiving the first reference current, to provide a bias voltage level according to the first reference current.

The present invention further discloses a bias compensation circuit for providing a bias voltage level to a first amplifier transistor. The bias compensation circuit includes a detecting circuit, including a diode-connected transistor circuit, with a first end for receiving a first current, and a second end coupled to a first reference voltage end; wherein the detecting circuit provides a first voltage level according to the diode-connected transistor circuit including a diode-connected transistor, and the first amplifier transistor and the diode-connected transistor comprises a same or similar process corner; a voltage-current converting circuit, coupled to the diode-connected transistor circuit, for generating a first reference current according to the first voltage level and a second voltage level; and a bias circuit, coupled to the voltage-current converting circuit, for receiving the first reference current, to provide the bias voltage level to the first amplifier transistor according to the first reference current.

DETAILED DESCRIPTION

Figure 1:
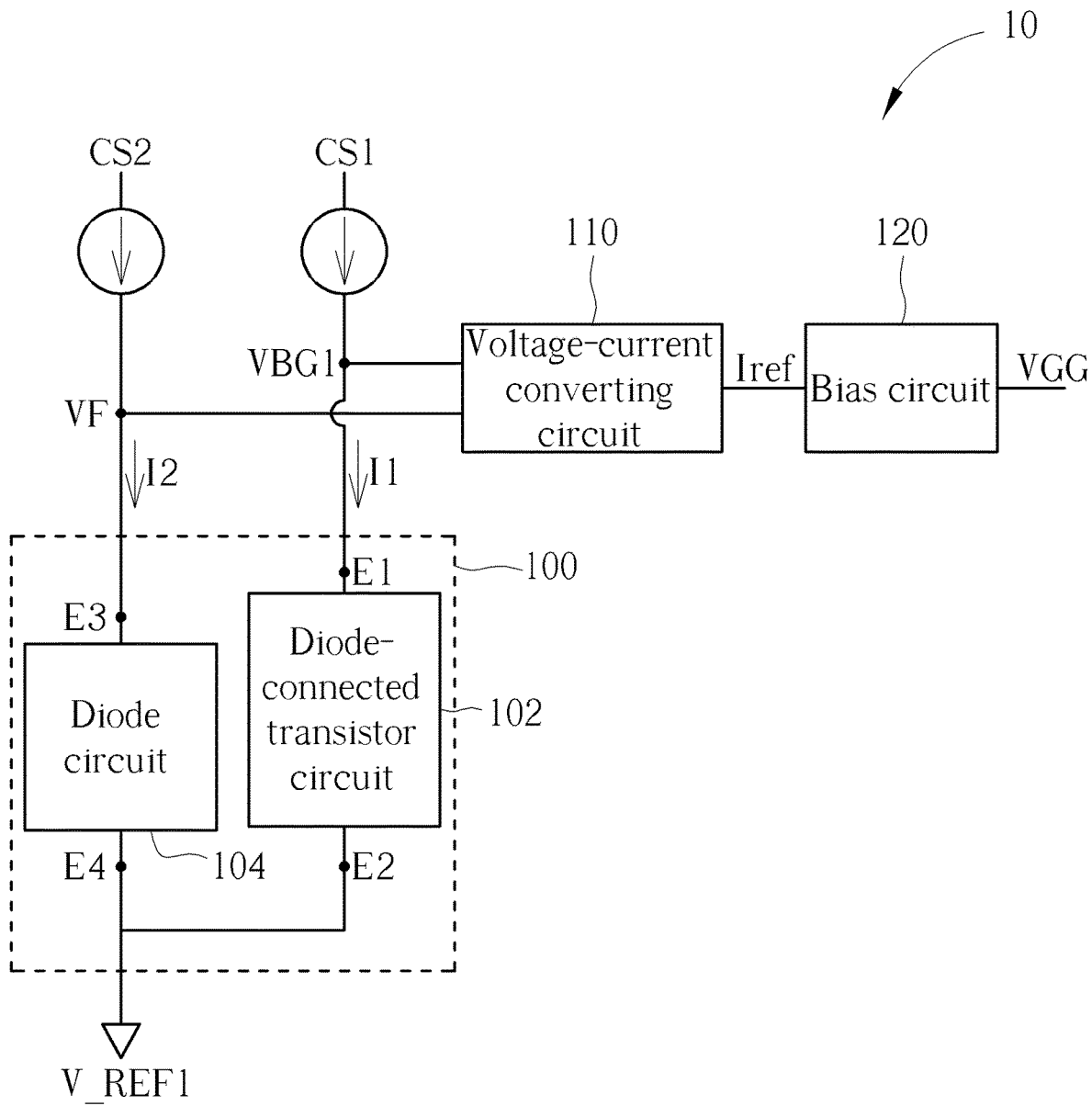
FIG. 1 is a schematic diagram of a bias compensation circuit according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a schematic diagram of a bias compensation circuit 10 according to an embodiment of the present invention. The bias compensation circuit 10 may be used in an amplifier (e.g., a power amplifier). The bias compensation circuit 10 includes a detecting circuit 100, a voltage-current converting circuit 110 and a bias circuit 120. The detecting circuit 100 includes a diode-connected transistor circuit 102 and a diode circuit 104. The diode-connected transistor circuit 102 has a first end E1 and a second end E2. The first end E1 of the diode-connected transistor circuit 102 may be used for receiving a current I1, and the second end E2 of the diode-connected transistor circuit 102 may be coupled to a reference voltage end V_REF1. The diode circuit 104 has a first end E3 and a second end E4. The first end E3 of the diode circuit 104 may be used for receiving a current I2, and the second end E4 of the diode circuit 104 may be coupled to the reference voltage end V_REF1. The voltage-current converting circuit 110 is coupled to the diode-connected transistor circuit 102 and the diode circuit 104. The bias circuit 120 is coupled to the voltage-current converting circuit 110. In detail, the detecting circuit 100 may provide a voltage level VBG1 according to the diode-connected transistor circuit 102, and may provide a voltage level VF according to the diode circuit 104. The voltage-current converting circuit 110 may generate a reference current Iref according to the voltage level VBG1 and the voltage level VF. The bias circuit receives the reference current Iref, to provide a bias voltage level VGG according to the reference current Iref.

It should be noted that the transistors may have different performances according to effects of factors such as voltage or temperature. Thus, due to different process corners, the transistors may have different characteristics. The process corners of the transistors can be classified as TT, FF and SS. The process variation between the two transistors is not large, when two transistors have a same or similar process corner. In contrast, the process variation between two transistors is relatively large, when the two transistors have the process corners with large difference.

In one embodiment, a current source CS1 may be coupled to the first end E1 of the diode-connected transistor circuit 102, and the current source CS1 may be used to provide the current I1. In one embodiment, a current source CS2 may be coupled to the first end E3 of the diode circuit 104, and the current source CS2 may be used to provide the current I2. In one embodiment, the reference voltage end V_REF1 may be a ground voltage or a common voltage, but is not limited thereto.

In one embodiment, the bias voltage level VGG may be provided to an amplifier (e.g., a power amplifier). In one embodiment, the diode-connected transistor circuit 102 may include at least one diode-connected transistor, and the at least one diode-connected transistor and an amplifier transistor have a same or similar process corner. In one embodiment, the voltage level VF may be one of a voltage level VBE not affected by the process easily (e.g., a voltage level not relative to the process variation) or a voltage level VBG not affected by the temperature easily (e.g., a voltage level not relative to the temperature variation). In one embodiment, the diode-connected transistor circuit 102 may be used for detecting the process corner, if the voltage level VF is the voltage level VBE. In one embodiment, a distance between the diode circuit 104 and the amplifier transistor is greater than a distance between diode-connected transistor circuit 102 and the amplifier transistor. In this situation, the diode-connected transistor circuit 102 may be used for detecting the temperature of the amplifier transistor, if the voltage level VF is the voltage level VBG.

According to the above description, the present invention discloses a bias compensation circuit for adjusting the reference current. The bias compensation circuit may provide the bias voltage level to adjust the current passing through the amplifier according to the reference current. Thus, the current passing through the amplifier may be adjusted for reducing the effect caused by the temperature and the process corner of the amplifier.

Figure 2:
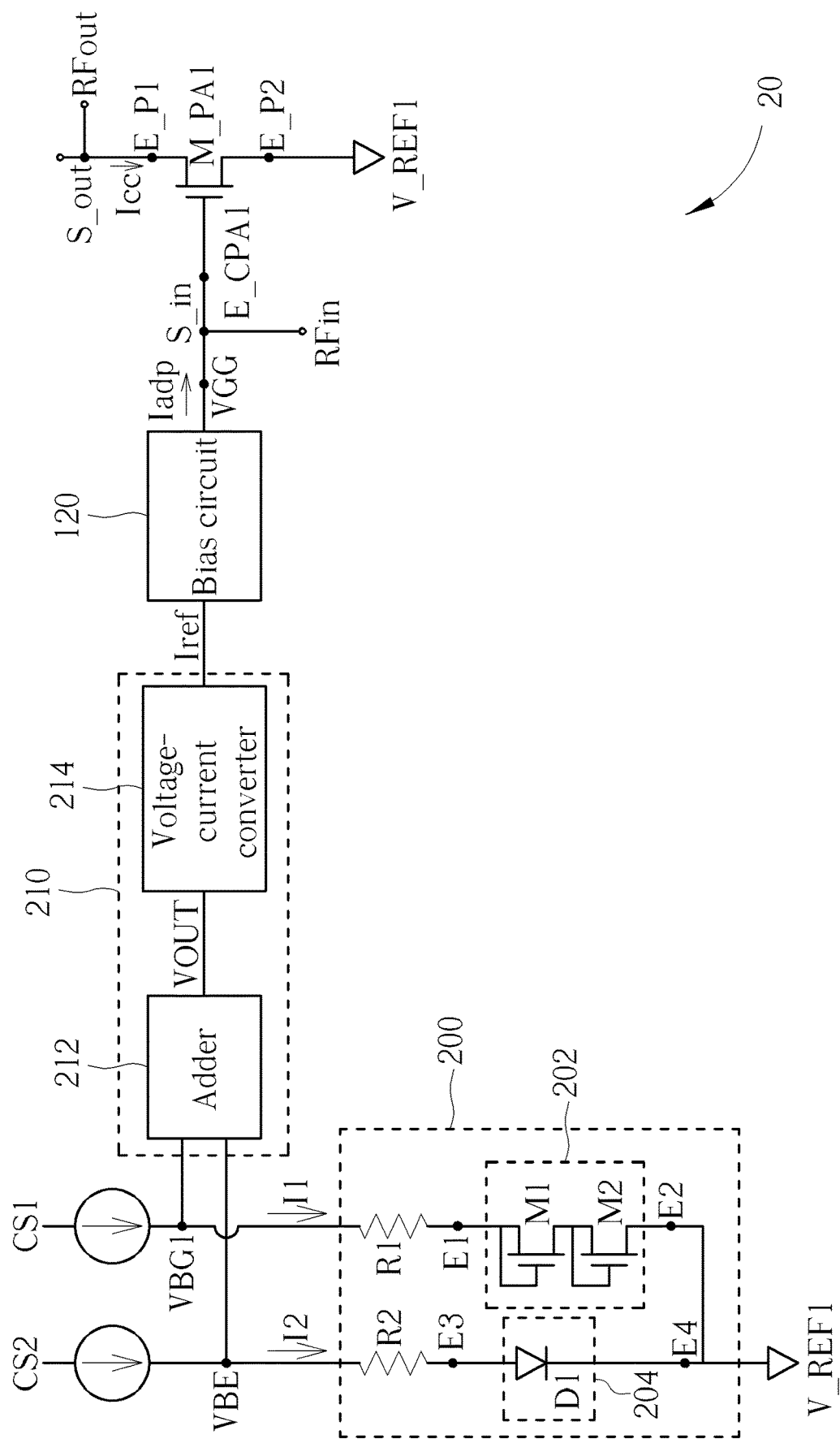
FIG. 2 is a schematic diagram of a bias compensation circuit according to an embodiment of the present invention.

FIG. 2 is a schematic diagram of a bias compensation circuit 20 according to an embodiment of the present invention. The bias compensation circuit 20 includes a detecting circuit 200, a voltage-current converting circuit 210 and a bias circuit 120. The detecting circuit 200 may be used for implementing the detecting circuit 100, and the voltage-current converting circuit 210 may be used for implementing the voltage-current converting circuit 110. The detecting circuit 200 includes a diode-connected transistor circuit 202 and a diode circuit 204. The diode-connected transistor circuit 202 may include a diode-connected transistor M1 and a diode-connected transistor M2. The diode-connected transistor circuit 202 has a first end E1 and a second end E2. The diode-connected transistor M1 is coupled to the first end E1 of the diode-connected transistor circuit 202, and the diode-connected transistor M2 is coupled between the diode-connected transistor M1 and the second end E2 of the diode-connected transistor circuit 202. The diode circuit 204 has a first end E3 and a second end E4. The diode circuit may include a diode D1. In detail, the detecting circuit 200 may provide a voltage level VBG1 according to the diode-connected transistor circuit 202, and may provide a voltage level VBE according to the diode circuit 204. The voltage-current converting circuit 210 may generate a reference current Iref according to the voltage level VBG1 and the voltage level VBE. After receiving the reference current Iref, the bias circuit 120 may provide a bias voltage level VGG to the amplifier with an amplifier transistor M_PA1 according to the reference current Iref.

In one embodiment, the voltage-current converting circuit 210 may include an adder 212 and a voltage-current converter 214. The adder 212 may be coupled to the detecting circuit 200, and the voltage-current converter 214 may be coupled to the adder 212. In one embodiment, the adder 212 may generate an output voltage level VOUT according to the voltage level VBG1 and the voltage level VBE. In one embodiment, the voltage-current converter 214 may generate the reference current Iref according to the output voltage level VOUT.

In one embodiment, the detecting circuit 200 may include at least one of the resistors R1 and R2. That is, in the situation that the process corner TT is satisfied, the voltage level VBG1 and the voltage level VBE are the same. Thus, the resistor R1 and R2 may both exist, or only one of the resistors R1 and R2 may exist. In one embodiment, the resistor R1 may be coupled to the first end E1 of the diode-connected transistor circuit 202. In one embodiment, the resistor R2 may be coupled to the first end E3 of the diode circuit 204. In one embodiment, the current source CS1 may be coupled to the resistor R1. In one embodiment, the current source CS2 may be coupled to the resistor R2. In one embodiment, the detecting circuit 200 may provide the voltage level VBG1 according to the diode-connected transistor circuit 202 and the resistor R1. In one embodiment, the detecting circuit 200 may provide the voltage level VBE according to the diode circuit 204 and the resistor R2. That is, the resistor R1 may be used for adjusting the voltage level VBG1, and the resistor R2 may be used for adjusting the voltage level VBE. In one embodiment, the voltage level VBG1 and the voltage level VBE are generated according to the following equations:

$$VBG1 = I1*R1 + N*VGS \quad \text{(Eq. 1)}$$

$$VBE = I2*R2 + V\_D1 \quad \text{(Eq. 2)},$$

wherein N is the number of the diode-connected transistors coupled in series included in the diode-connected transistor circuit 202, VGS is a turn-on voltage of the diode-connected transistor, and V_D1 is a turn-on voltage of the diode D1.

In one embodiment, the diode-connected transistor circuit 202 may include at least one of the diode-connected transistors M1 and M2. In one embodiment, the at least one of the diode-connected transistors M1 and M2 in the diode-connected transistor circuit 202 and the amplifier transistor M_PA1 have a same or similar process corner.

In one embodiment, the bias circuit 120 may provide the bias voltage level VGG to the amplifier transistor M_PA1. In one embodiment, an input signal RFin is input from a signal input end S_in, and the input signal RFin may be input to a control end E_CPA1 of the amplifier transistor M_PA1. According to the bias voltage level VGG, an adaptive current Iadp may be generated according to the power of the input signal RFin. It should be noted that the adaptive current Iadp has different intensities due to an offset, according to the process corner of the amplifier transistor M_PA1. In addition, the intensity of the adaptive current Iadp is 0 without the input signal RFin. In one embodiment, an output signal RFout is output via a signal output end S_out, wherein a current Icc is a working current passing through the amplifier transistor M_PA1, and the signal output end S_out may be located in a first end E_P1 of the amplifier transistor M_PA1. In one embodiment, a second end E_P2 of the amplifier transistor M_PA1 may be coupled to the reference voltage end V_REF1.

Since the diode-connected transistors M1, M2 and the amplifier transistor M_PA1 have a same or similar process corner, the voltage level VBG1 is changed with a process variation of the amplifier transistor M_PA1. However, the voltage level VBE is not changed easily with the process variation of the amplifier transistor M_PA1. Thus, the detecting circuit 200 detects the process variation of the amplifier transistor M_PA1 according to the voltage level VBG1, and generates the corresponding reference current Iref, to compensate the process variation. That is, the diode-connected transistor circuit 202 may be used for detecting the process corner so that the amplifier transistor M_PA1 manufactured with different process corners may still have a same or similar adaptive current Iadp under the condition of different powers of the input signal RFin. The adaptive current Iadp makes the working current Icc passing through the amplifier transistor M_PA1 the same or similar so that the amplifier transistor M_PA1 still has the same or similar linearity under different process corners. For example, the detecting circuit 200 may enable the amplifier transistors M_PA1 manufactured with different process corners to have the same or similar relationship curve of the power of input signal RFin and the adaptive current Iadp.

Figure 3:
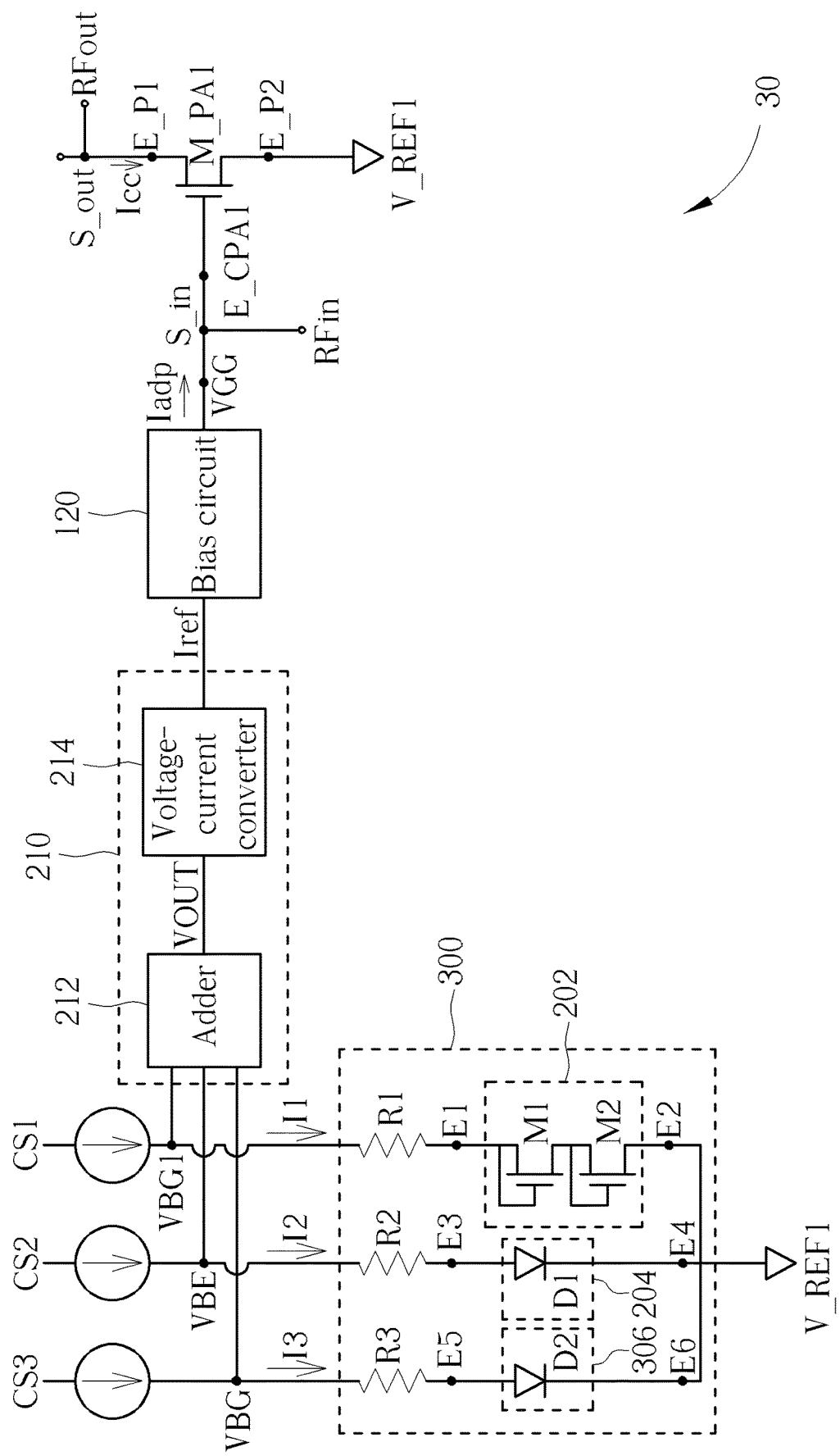
FIG. 3 is a schematic diagram of a bias compensation circuit according to an embodiment of the present invention.

FIG. 3 is a schematic diagram of a bias compensation circuit 30 according to an embodiment of the present invention. The bias compensation circuit 30 includes a detecting circuit 300, a voltage-current converting circuit 210 and a bias circuit 120. Compared with the bias compensation circuit 20, the detecting circuit 300 further includes a diode circuit 306. The diode circuit 306 has a first end E5 and a second end E6. The first end E5 of diode circuit 306 may be used for receiving a current I3, and the second end of the diode circuit 306 may be coupled to the reference voltage end V_REF1. The diode circuit 306 may include a diode D2. The detecting circuit 200 may provide the voltage level VBG according to the diode circuit 306.

In one embodiment, the detecting circuit 300 may include a resistor R3, and the resistor R3 is coupled to the first end E5 of the diode circuit 306. In one embodiment, a current source CS3 may be coupled to the resistor R3, and the current source CS3 may be used for providing the current I3. In one embodiment, the detecting circuit 300 may provide the voltage level VBG according to the diode circuit 306 and the resistor R3. That is, the resistor R3 may be used for adjusting the voltage level VBG. In one embodiment, the voltage level VBG is generated according to the following equation:

$$VBG = I3*R3 + V\_D2 \quad \text{(Eq. 3)},$$

wherein V_D2 is a turn-on voltage of the diode D2. In one embodiment, the adder 212 may generate the output voltage level VOUT according to the voltage levels VBG1, VBE and VBG. The voltage-current converter 214 may generate the reference current Iref according to the output voltage level VOUT. The bias circuit 120 may provide the bias voltage level VGG according to the reference current Iref.

The operation and the functions of the other circuit elements can be referred to the previous description, and is not repeated thereto.

In one embodiment, the diode-connected transistor circuit 202 may include at least one of the diode-connected transistors M1 and M2. In one embodiment, the at least one of the diode-connected transistors M1 and M2 in the diode-connected transistor circuit 202 and the amplifier transistor M_PA1 have a same or similar process corner. In this situation, the diode-connected transistor circuit 202 may be used for detecting the process corner due to the same or similar process corner of the diode-connected transistor circuit 202 and the amplifier transistor M_PA1, when the voltage levels VBE and VBG exist. The principle and the function of detecting the process corner can be referred to the previous description, and is not repeated thereto.

In one embodiment, a distance between the diode circuit 204 and the amplifier transistor M_PA1 is greater than a distance between the diode circuit 306 and the amplifier transistor M_PA1. For example, the diode circuit 306 and the amplifier transistor M_PA1 may be disposed in the same die, and the diode circuit 204 may be disposed in another die. In this situation, the diode circuit 306 may be used for detecting the temperature of the amplifier transistor M_PA1 so that the amplifier transistor M_PA1 with different temperatures may still have a same or similar adaptive current Iadp under the condition of different power of the input signal RFin. The adaptive current Iadp makes the working current Icc passing through the amplifier transistor M_PA1 is the same or similar so that the amplifier transistor M_PA1 still has the same or similar linearity under different temperatures. For example, the detecting circuit 200 may enable the amplifier transistors M_PA1 with different temperatures to have the same or similar relationship curve of the power of input signal RFin and the adaptive current Iadp.

In one embodiment, the output voltage level may be generated according to the following equation:

$$VOUT = K1*VBG + K2*(VBG-VBE) + K3*(VBG1-VBE) \quad \text{(Eq. 4)},$$

wherein K1 is the basic parameter, K2 is the temperature compensation parameter and K3 is the process compensation parameter. In detail, the voltage level VBE is changed with the temperature of the amplifier transistor M_PA1, and the voltage level VBG is not changed easily with the temperature of the amplifier transistor M_PA1. Thus, the detecting circuit 300 may detect the change of the temperature of the amplifier transistor M_PA1 according to the voltage levels VBE and VBG, and may be used for compensating the effect due to the change of the temperature of the amplifier transistor M_PA1. On the other hand, the voltage level VBG1 is changed with the process variation of the amplifier transistor M_PA1, and the voltage level VBE is not changed easily with the process variation of the amplifier transistor M_PA1. Thus, the detecting circuit 300 may detect the process variation of the amplifier transistor M_PA1 according to the voltage levels VBG1 and VBE, and may be used for compensating the effect due to the process variation of the amplifier transistor M_PA1. It should be noted that the equation (Eq. 4) may be adjusted adaptively according to the number of the voltage levels provided to the adder 212. In one embodiment, K1, K2 and K3 may be configured to 0 or appropriate non-zero value according to the design requirements, and K1, K2 and K3 may not be 0 at the same time.

Figure 4:
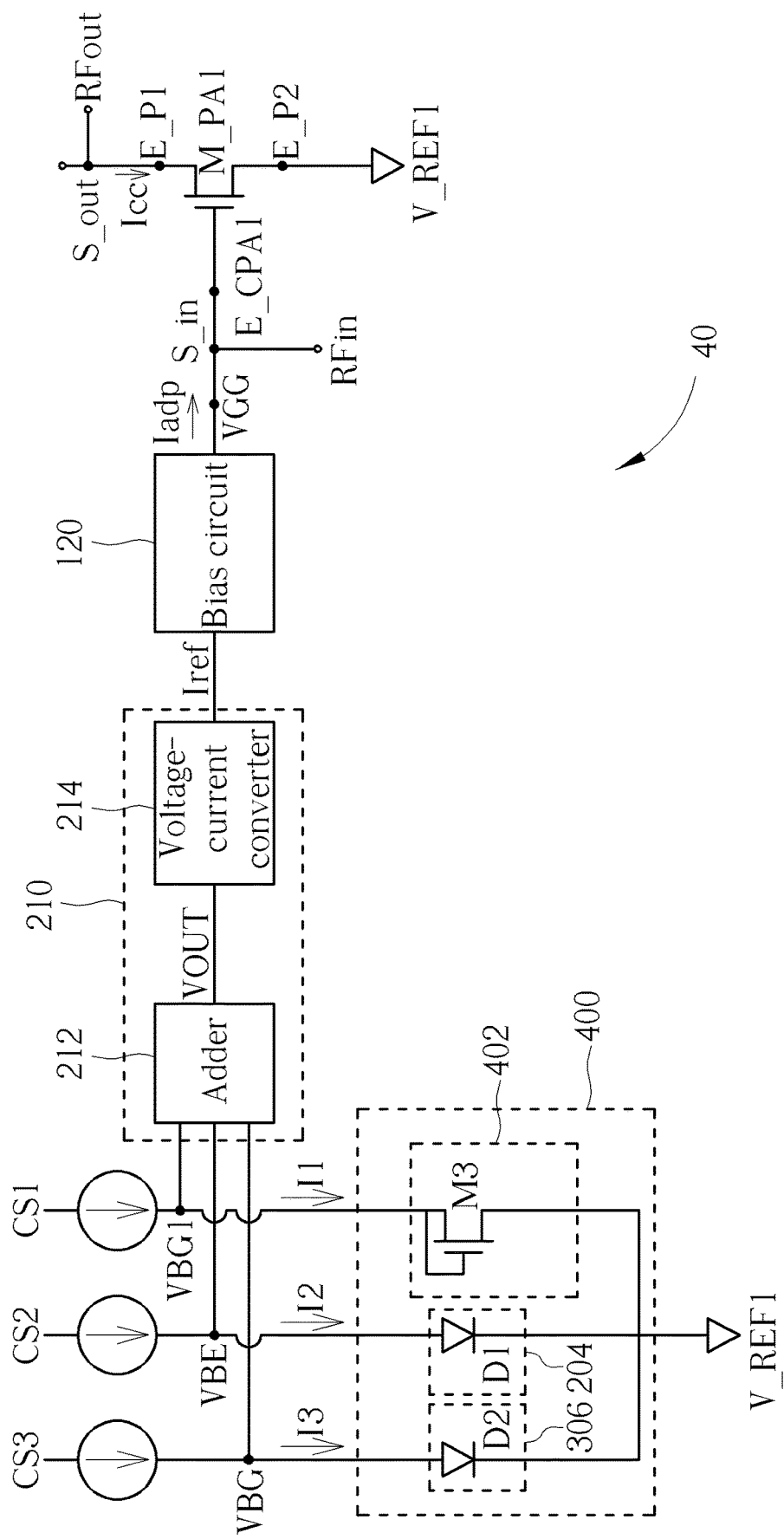
FIG. 4 is a schematic diagram of a bias compensation circuit according to an embodiment of the present invention.

FIG. 4 is a schematic diagram of a bias compensation circuit 40 according to an embodiment of the present invention. The bias compensation circuit 40 includes a detecting circuit 400, a voltage-current converting circuit 210 and a bias circuit 120. The detecting circuit 400 includes a diode-connected transistor circuit 402, the diode circuit 204 and the diode circuit 306. Compared with the bias compensation circuit 20, the resistors may be omitted in whole or in part, or the diode-connected transistor circuit 402 may simply include a diode-connected transistor M3. The diode-connected transistor M3 may be the diode-connected transistor M1 or the diode-connected transistor M2, and is not limited thereto. The operations for the bias compensation circuit 20 or 30 can be applied to the bias compensation circuit 40, and is not repeated thereto.

Figure 5:
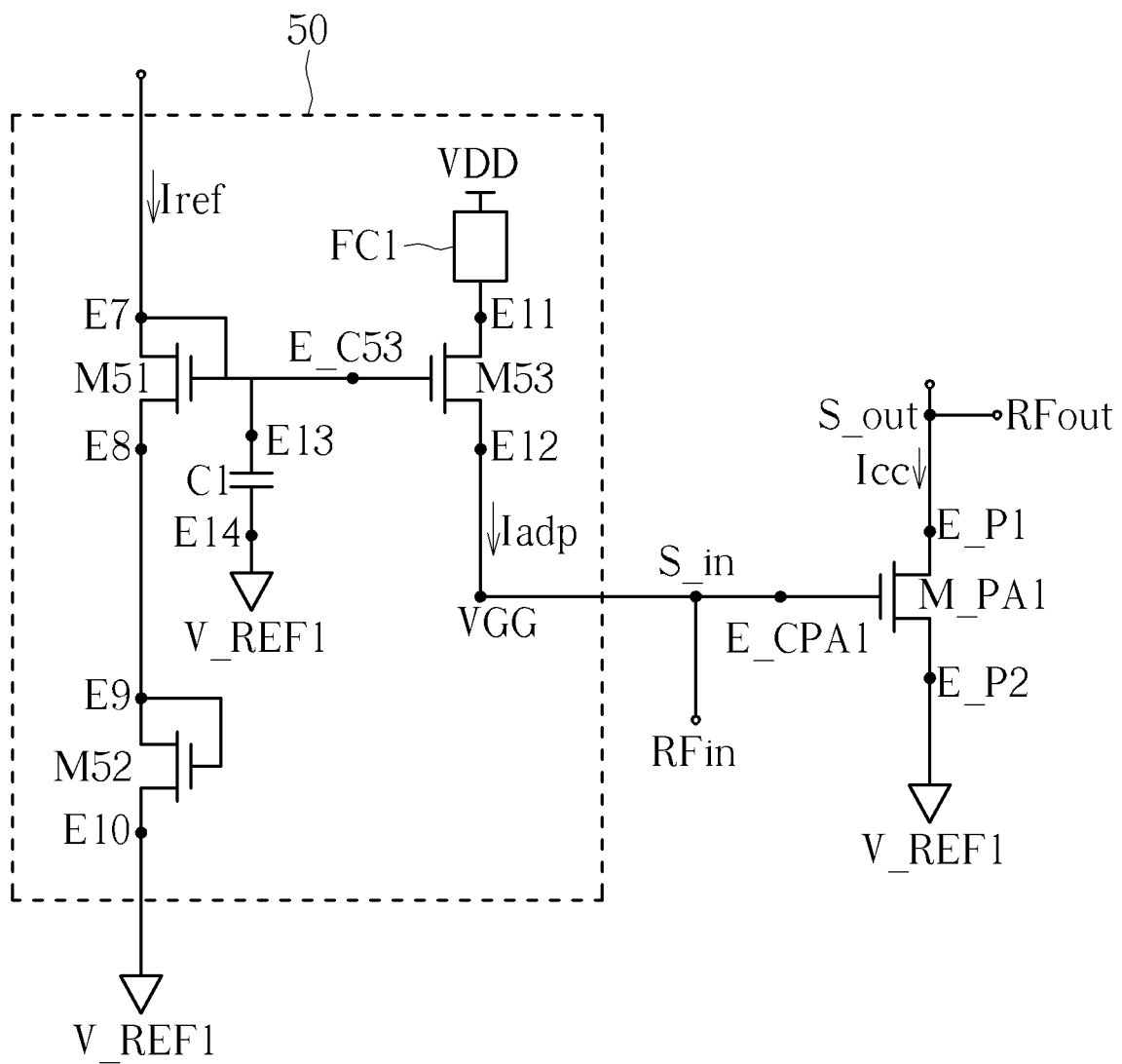
FIG. 5 is a schematic diagram of a bias circuit according to an embodiment of the present invention.

FIG. 5 is a schematic diagram of a bias circuit 50 according to an embodiment of the present invention. The bias circuit 50 may be used for implementing the bias circuit 120. The bias circuit 50 may include a diode-connected transistor M51, a diode-connected transistor M52, a transistor M53 and a capacitor C1. The diode-connected transistor M51 has a first end E7 and a second end E8. The diode-connected transistor M52 has a first end E9 and a second end E10. The transistor M53 has a first end E11, a second end E12 and a control end E_C53. The capacitor C1 has a first end E13 and a second end E14. The first end E7 of the diode-connected transistor M51 may be used for receiving the reference current Iref. The reference current Iref may be provided by the voltage-current converter 210 which is described previously. The first end E9 of the diode-connected transistor M52 may be coupled to the second end E8 of the diode-connected transistor M51, and the second end E10 of the diode-connected transistor M52 may be coupled to the reference voltage end V_REF1. The first end E11 of the transistor M53 may be coupled to a system voltage end VDD, and the control end E_C53 of the transistor M53 may be coupled to the first end E7 of the diode-connected transistor M51. The first end E13 of the capacitor C1 may be coupled to the first end E7 of the diode-connected transistor M51 and the control end E_C53 of the transistor M53, and second end E14 of the capacitor C1 may be coupled to the reference voltage end V_REF1.

In one embodiment, the bias circuit 50 provides the bias voltage level VGG to the amplifier transistor M_PA1 at the second end E12 of the transistor M53. The input signal RFin has the adaptive current Iadp according to the bias voltage level VGG. In one embodiment, the bias circuit 50 further includes a filter circuit FC1, and the filter circuit FC1 may be coupled between the system voltage end VDD and the transistor M53. In one embodiment, the filter circuit FC1 may be a low-pass filter circuit, and is not limited thereto.

It should be noted that the capacitor C1 may be used for adjusting the current curve of the adaptive current Iadp. That is, the current curve of the adaptive current Iadp may be adjusted via adjusting the capacitor C1, to further adjust the current curve of the current Icc.

The operation modes and the functions of the other circuit elements can be referred to the previous description, and is not repeated thereto.

Figure 6A:
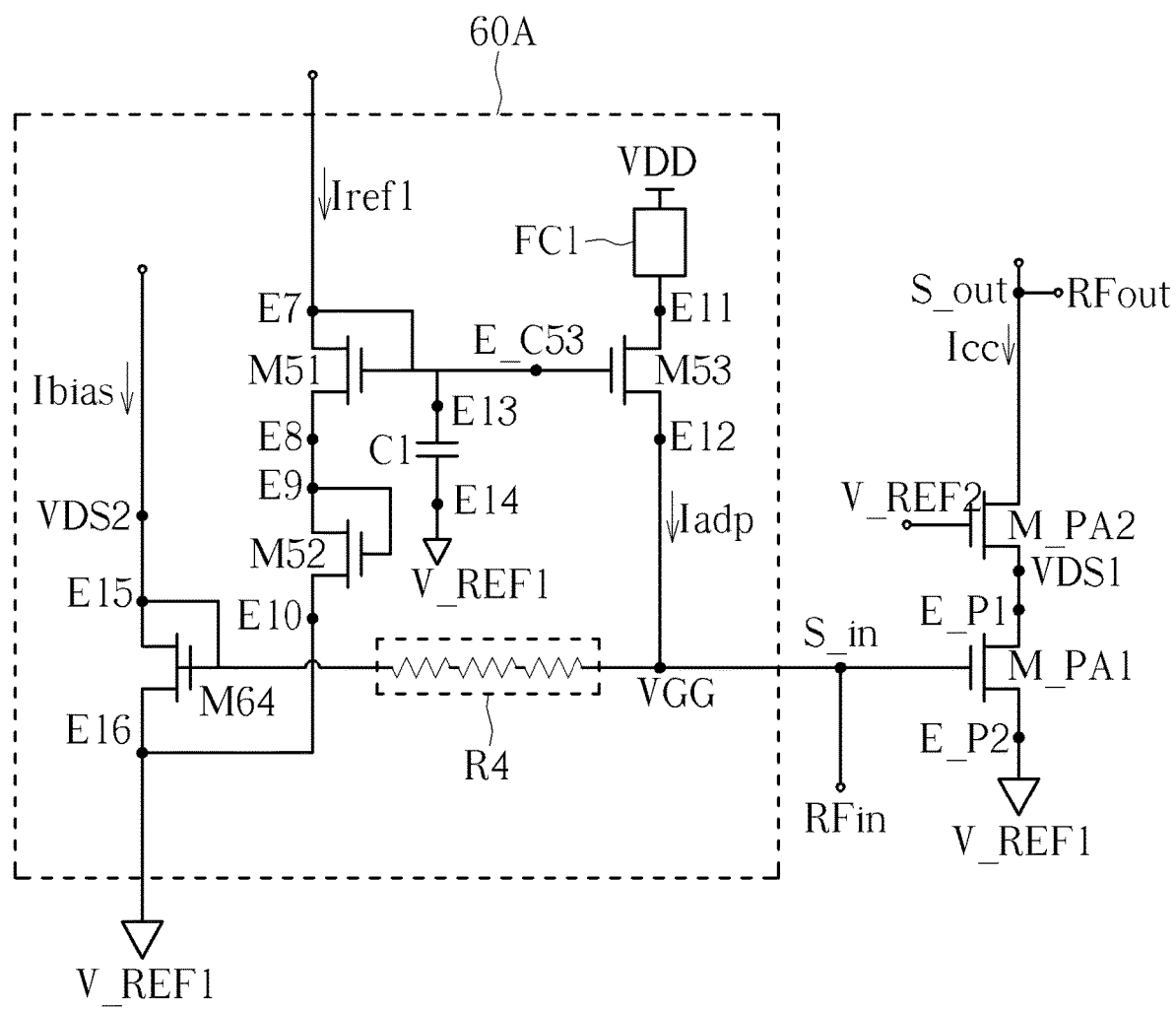
FIG. 6A and FIG. 6B are schematic diagrams of a bias circuit according to an embodiment of the present invention.

FIG. 6A is a schematic diagram of a bias circuit 60A according to an embodiment of the present invention. The bias circuit 60A may be used for implementing the bias circuit 120. The bias circuit 60A may include the diode-connected transistor M51, the diode-connected transistor M52, the transistor M53, the capacitor C1, a diode-connected transistor M64 and a resistor circuit R4. The coupling relationship of the diode-connected transistors M51 and M52, the transistor M53 and the capacitor C1 may be referred to the previous description and is not repeated thereto. Compared with the bias circuit 50, the first end E7 of the diode-connected transistor M51 may be used for receiving a reference current Iref1. The reference current Iref1 may be the reference current Iref provided by the voltage-current converting circuit 210 described previously. In addition, in the bias circuit 60A, the diode-connected transistor M64 has a first end E15 and a second end E16. The first end E15 of the diode-connected transistor M64 may be used for receiving a bias current Ibias, the second end E16 of the diode-connected transistor M64 may be coupled to the reference voltage end V_REF1, and the control end of the diode-connected transistor M64 may be coupled to the first end E15 of the diode-connected transistor M64. The resistor circuit R4 may be coupled between the control end of the diode-connected transistor M64 and the second end E12 of the transistor M53.

Figure 6B:
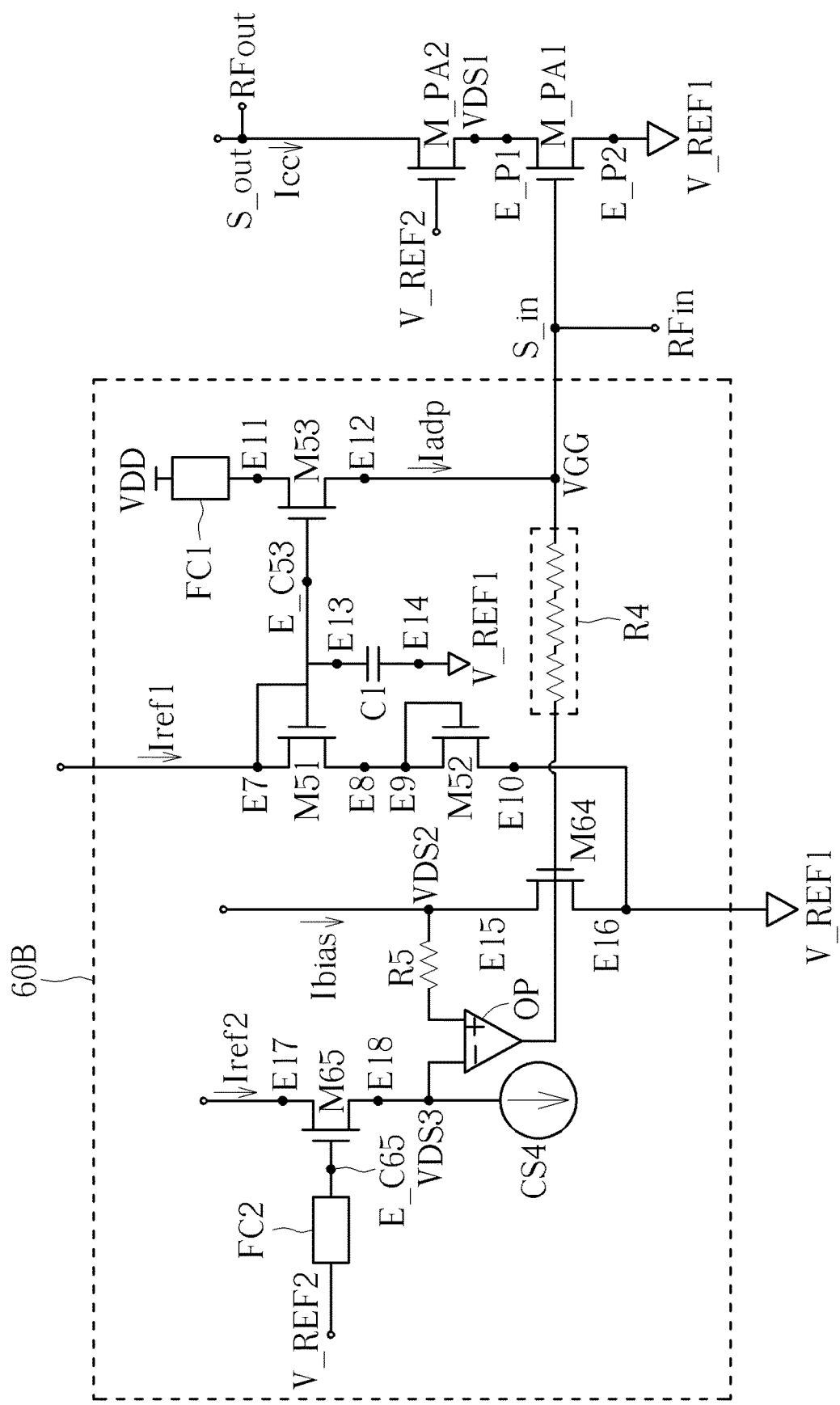

FIG. 6B is a schematic diagram of a bias circuit 60B according to an embodiment of the present invention. The bias circuit 60B may be used for implementing the bias circuit 120. Compared with the bias circuit 60A, the control end of the diode-connected transistor M64 may not be coupled to the first end E15 of the diode-connected transistor M64. In one embodiment, the bias circuit 60B may further include a transistor M65. The transistor M65 has a first end E17, a second end E18 and a control end E_C65. In one embodiment, the first end E17 of the transistor M65 may be used for receiving a reference current Iref2, the second end E18 of the transistor M65 may be coupled to a current source CS4, and the control end E_C65 of the transistor M65 may be coupled to a reference voltage end V_REF2. In one embodiment, the bias circuit 60B may further include an operational amplifier OP. The operational amplifier OP has a first end (i.e., the non-inverting input of the operational amplifier OP, which is expressed as "+"), a second end (i.e., the inverting input of the operational amplifier OP, which is expressed as "−") and an output end. In one embodiment, the first end of the operational amplifier OP may be coupled to the second end E18 of the transistor M65, and the output end of the operational amplifier may be coupled to the control end of the diode-connected transistor M64. In one embodiment, the bias circuit 60B may further include a resistor R5. The resistor R5 may be coupled between the second end of the operational amplifier OP and the first end E15 of the diode-connected transistor M64. In one embodiment, the bias circuit may further include a filter circuit FC2 coupled between the reference voltage end V_REF2 and the control end E_C65 of the transistor M65. In one embodiment, the filter circuit FC2 may be a low-pass filter circuit, and is not limited thereto.

In one embodiment, the resistor circuit R4 may include a plurality of resistors coupled in series. Similar to the capacitor C1, the resistor circuit R4 may be used for adjusting the current curve of the adaptive current Iadp, to further adjust the current curve of the current Icc. Thus, the current Icc may be stably maintained by adjusting the current curve of the current Iadp so that the amplifier transistor M_PA1 may maintain good linearity.

In one embodiment, the first end E_P1 of the amplifier transistor M_PA1 may have a voltage level VDS1. The first end E15 of the diode-connected transistor M64 may have a voltage level VDS2. The second end E18 of the transistor M65 may have a voltage level VDS3. The operational amplifier OP may be used for maintaining the voltage level VDS2 and the voltage level VDS3 equal to each other. That is, the operation amplifier OP is used for maintaining the voltage level VDS3 of the second end E18 of the transistor M65 and the voltage level VDS2 of the first end E15 of the diode-connected transistor M64 equal to each other. The voltage level VDS1 may be the same as the voltage level VDS3 or similar to the voltage level VDS3 via maintaining the voltage level VDS3 equal to the voltage level VDS2. The reference current Iref2 may be stably mirrored and amplified into the working current Icc passing through the amplifier transistor M_PA1. Thus, even if the amplifier transistor M_PA1 is manufactured with different process corners, the reference current Iref2 may still be stably mirrored and amplified into the current Icc, to maintain the linear performance of the power amplifier.

In one embodiment, the bias circuits 60A and 60B may provide the bias voltage level VGG to the amplifier transistor M_PA1. Compared with the bias circuit 50, the amplifier transistor M_PA1 cascades the amplifier M_PA2. In one embodiment, the transistor M65 matches the amplifier transistor M_PA2. That is, the layout of the transistor M65 and the amplifier transistor M_PA2 may be in the same direction, and the transistor M65 and the amplifier transistor M_PA2 may be placed similar to each other so that the reference current Iref2 and the current Icc have better mirroring.

Figure 7:
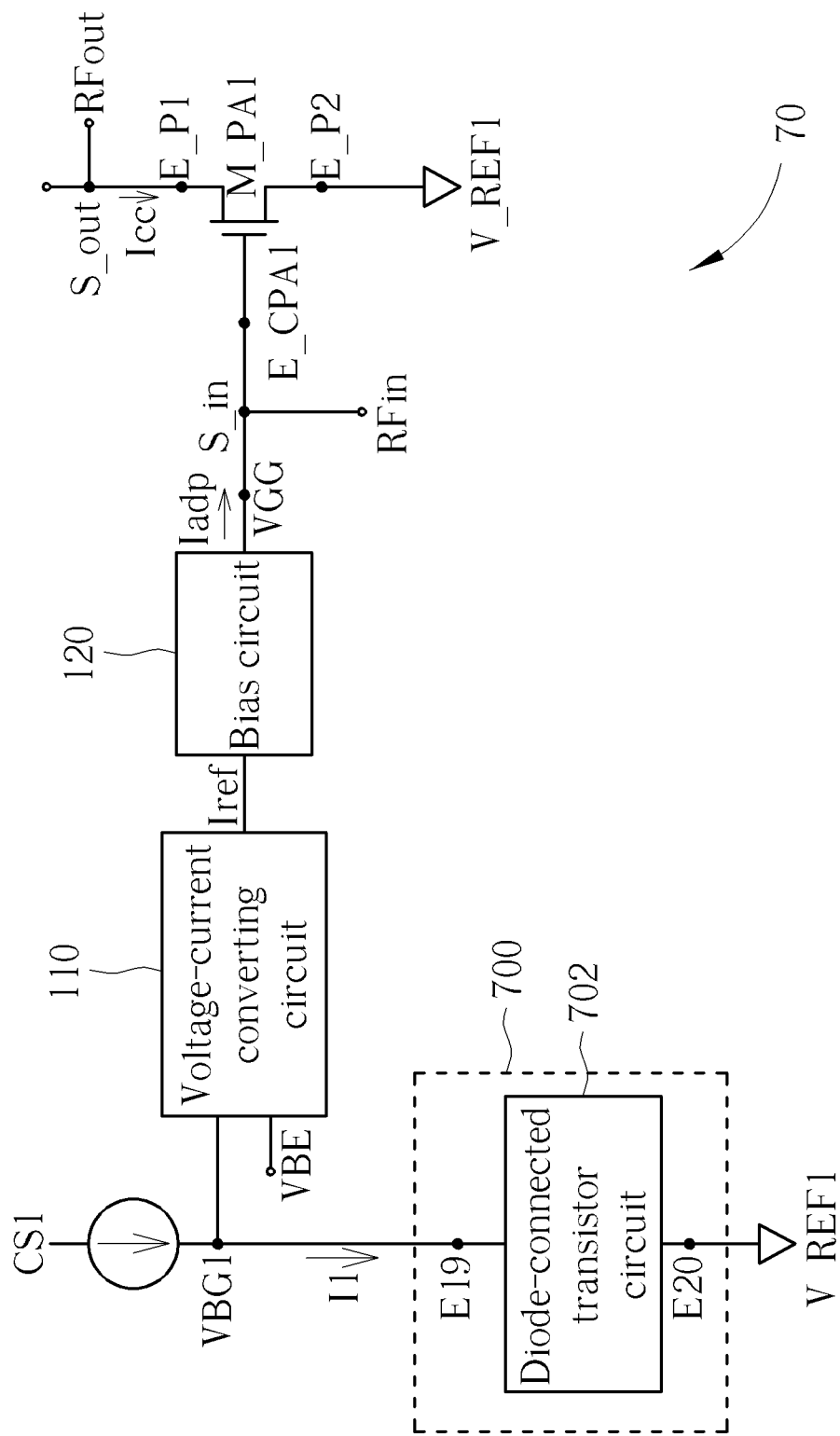
FIG. 7 is a schematic diagram of a bias compensation circuit according to an embodiment of the present invention.

FIG. 7 is a schematic diagram of a bias compensation circuit 70 according to an embodiment of the present invention. The bias compensation circuit 70 may be applied in an amplifier (e.g., a power amplifier). The bias compensation circuit 70 includes a detecting circuit 700, a voltage-current converting circuit 110 and a bias circuit 120. The detecting circuit 700 includes a diode-connected transistor circuit 702. The diode-connected transistor circuit 702 has a first end E19 and a second end E20. The first end E19 of the diode-connected transistor circuit 702 may be used for receiving the current I1, and the second end E20 of the diode-connected transistor circuit 702 may be coupled to the reference voltage end V_REF1. The current I1 may be provided by the current source CS1. The diode-connected transistor circuit 702 may include at least one diode-connected transistor, and the at least one diode-connected transistor and the amplifier transistor have a same or similar process corner. Compared with the bias compensation circuit 20, the resistor R1 may be alternatively omitted according to the design requirement. The diode circuit 204, the resistor R2 and the current source CS2 may be omitted. The voltage level VBE, which is not affected easily by the process (e.g., the fixed voltage level not changed easily with the process variation), is provided from the external circuit to the voltage-current converting circuit 110. The voltage-current converting circuit 110 may generate the reference current Iref according to the voltage levels VBG1 and VBE. The bias circuit 120 receives the reference current Iref, to provide the voltage level VGG to the amplifier transistor M_PA1 according to the reference current Iref. The operations and the functions of the embodiment of the present invention may be referred to the previous description, and is not repeated thereto.

According to the above, the present invention provides a bias compensation circuit to adjust the reference current. The bias circuit may generate the voltage level according to the reference current, to adjust the working current passing through the amplifier. Thus, the effect to the working current due to the process variation of the amplifier may be reduced.

The operations applied to the bias compensation circuit 20 may be applied to the bias compensation circuit 70, and is not repeated thereto.

In conclusion, the present invention provides a bias compensation circuit to adjust the reference current. The bias circuit may generate the voltage level according to the reference current, to adjust the working current passing through the amplifier. Thus, the working current passing through the amplifier can be adjusted. Even if the amplifiers are manufactured with different process corners, or the amplifiers are operated under different temperatures, the linearity of the amplifiers is the same or similar so that the working currents of the amplifiers are maintained stable. In addition, even if the power of the input signal is different, the amplifier with the bias compensation circuit may still maintain the stable performance of the linearity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A bias compensation circuit, comprising:
a detecting circuit, comprising;
a diode-connected transistor circuit, with a first end for receiving a first current, and a second end coupled to a first reference voltage end; and
a first diode circuit, with a first end for receiving a second current, and a second end coupled to the first reference voltage end;
wherein the detecting circuit provides a first voltage level according to the diode-connected transistor circuit, and provides a second voltage level according to the first diode circuit;
a voltage-current converting circuit, coupled to the detecting circuit, for generating a first reference current according to the first voltage level and the second voltage level; and
a bias circuit, coupled to the voltage-current converting circuit, for receiving the first reference current, to provide a bias voltage level according to the first reference current.

2. The bias compensation circuit of claim 1, wherein the diode-connected transistor circuit comprises:
a first diode-connected transistor, coupled to the first end of the diode-connected transistor circuit; and
a second diode-connected transistor, coupled between the first diode-connected transistor and the second end of the diode-connected transistor circuit.

3. The bias compensation circuit of claim 1, wherein the voltage-current converting circuit comprises:
an adder, coupled to the detecting circuit, for generating an output voltage level according to the first voltage level and the second voltage level; and
a voltage-current converter, coupled to the adder, for generating the first reference current according to the output voltage level.

4. The bias compensation circuit of claim 1, wherein the detecting circuit further comprises:
a first resistor, coupled to the first end of the diode-connected transistor circuit; and
a second resistor, coupled to the first end of the first diode circuit;
wherein the detecting circuit provides the first voltage level according to the diode-connected transistor circuit and the first resistor, and provides the second voltage level according to the first diode circuit and the second resistor.

5. The bias compensation circuit of claim 1, wherein the detecting circuit further comprises:
a second diode circuit, with a first end for receiving a third current and a second end coupled to the first reference voltage end;
wherein the detecting circuit provides a third voltage level according to the second diode circuit, and the voltage-current converting circuit generates the first reference current according to the first voltage level, the second voltage level and the third voltage level.

6. The bias compensation circuit of claim 5, wherein the bias circuit provides the bias voltage level to a first amplifier transistor, the diode-connected transistor circuit comprises at least one diode-connected transistor, and the first amplifier transistor and the at least one diode-connected transistor comprises a similar process corner or the same process corner.

7. The bias compensation circuit of claim 6, wherein a distance between the first diode circuit and the first amplifier transistor is greater than a distance between the second diode circuit and the first amplifier transistor.

8. The bias compensation circuit of claim 1, wherein the bias circuit comprises:

a third diode-connected transistor, with a first end for receiving the first reference current, and a second end;

a fourth diode-connected transistor, with a first end coupled to the second end of the third diode-connected transistor, and a second end coupled to the first reference voltage end;

a first transistor, with a first end coupled to a system voltage end, a second end, and a control end coupled to the first end of the third diode-connected transistor; and a capacitor, with a first end coupled to the first end of the third diode-connected transistor and the control end of the first transistor, and a second end coupled to the first reference voltage end.

9. The bias compensation circuit of claim 8, wherein the bias circuit provides the bias voltage level at the second end of the first transistor.

10. The bias compensation circuit of claim 8, wherein the bias circuit further comprises:

a first filter circuit, coupled between the system voltage end and the first transistor.

11. The bias compensation circuit of claim 8, wherein the bias circuit further comprises:

a fifth diode-connected transistor, with a first end for receiving a bias current, a second end coupled to the first reference voltage end, and a control end coupled to the first end; and a resistor circuit, coupled between the control end of the fifth diode-connected transistor and the second end of the first transistor.

12. The bias compensation circuit of claim 8, wherein the bias circuit further comprises:

a fifth diode-connected transistor, with a first end for receiving a bias current, and a second end coupled to the first reference voltage end;

a resistor circuit, coupled between the control end of the fifth diode-connected transistor and the second end of the first transistor;

a second transistor, with a first end for receiving a second reference current, a second end coupled to a current source, and a control end;

an operational amplifier, with a first end coupled to the second end of the second transistor, a second end, and an output end coupled to the first end of the fifth diode-connected transistor; and a third resistor, coupled between the second end of the operational amplifier and the first end of the fifth diode-connected transistor.

13. The bias compensation circuit of claim 12, wherein the bias circuit further comprises:

a second filter circuit, coupled between a second reference voltage end and the control end of the second transistor.

14. The bias compensation circuit of claim 12, wherein the bias circuit provides the bias voltage level to a first amplifier transistor cascading a second amplifier transistor, and the second transistor matches the second amplifier transistor.

15. The bias compensation circuit of claim 1, wherein the bias circuit provides the bias voltage level to a first amplifier transistor, the diode-connected transistor circuit comprises at least one diode-connected transistor, and the first amplifier transistor and the at least one diode-connected transistor comprises a same or similar process corner.

16. The bias compensation circuit of claim 1, wherein the bias circuit provides the bias voltage level to a first amplifier transistor, a distance between the first diode circuit and the first amplifier transistor is greater than a distance between the diode-connected transistor circuit and the first amplifier transistor.

17. A bias compensation circuit, for providing a bias voltage level to a first amplifier transistor, comprising:

a detecting circuit, comprising;

a diode-connected transistor circuit, with a first end for receiving a first current, and a second end coupled to a first reference voltage end;

wherein the detecting circuit provides a first voltage level according to the diode-connected transistor circuit comprising a diode-connected transistor, and the first amplifier transistor and the diode-connected transistor comprises a same or similar process corner;

a voltage-current converting circuit, coupled to the diode-connected transistor circuit, for generating a first reference current according to the first voltage level and a second voltage level; and a bias circuit, coupled to the voltage-current converting circuit, for receiving the first reference current, to provide the bias voltage level to the first amplifier transistor according to the first reference current;

wherein the voltage-current converting circuit comprises:

an adder, coupled to the detecting circuit, for generating an output voltage level according to the first voltage level and the second voltage level; and a voltage-current converter, coupled to the adder, for generating the first reference current according to the output voltage level.

18. The bias compensation circuit of claim 17, wherein the detecting circuit further comprises:

a resistor, coupled to the first end of the diode-connected transistor circuit;

wherein the detecting circuit provides the first voltage level according to the diode-connected transistor circuit and the resistor.

19. The bias compensation circuit of claim 17, wherein the bias circuit comprises:

a first diode-connected transistor, with a first end for receiving the first reference current, and a second end;

a second diode-connected transistor, with a first end coupled to the second end of the first diode-connected transistor, and a second end coupled to the first reference voltage end;

a first transistor, with a first end coupled to a system voltage end, a second end, and a control end coupled to the first end of the first diode-connected transistor; and a capacitor, with a first end coupled to the first end of the first diode-connected transistor and the control end of the first transistor, and a second end coupled to the first reference voltage end.

* * * * *